United States Patent
Hoang et al.

(10) Patent No.: US 10,344,124 B2
(45) Date of Patent: Jul. 9, 2019

(54) POLYETHER-BASED POLYMER COMPOSITION

(71) Applicant: ZEON CORPORATION, Tokyo (JP)

(72) Inventors: The Ban Hoang, Tokyo (JP); Keisuke Ohta, Tokyo (JP); Shigetaka Hayano, Tokyo (JP); Yasuo Tsunogae, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 71 days.

(21) Appl. No.: 15/553,305

(22) PCT Filed: Feb. 26, 2016

(86) PCT No.: PCT/JP2016/055846
§ 371 (c)(1),
(2) Date: Aug. 24, 2017

(87) PCT Pub. No.: WO2016/136951
PCT Pub. Date: Sep. 1, 2016

(65) Prior Publication Data
US 2018/0016391 A1 Jan. 18, 2018

(30) Foreign Application Priority Data
Feb. 27, 2015 (JP) .................. 2015-038137

(51) Int. Cl.
*C08K 3/04* (2006.01)
*C01B 32/05* (2017.01)
(Continued)

(52) U.S. Cl.
CPC .............. *C08G 65/08* (2013.01); *C01B 32/05* (2017.08); *C08K 3/041* (2017.05); *C08K 3/042* (2017.05);
(Continued)

(58) Field of Classification Search
CPC .. C09D 171/00; C09D 171/02; C09D 171/08; C09D 171/14; C09D 173/00;
(Continued)

(56) References Cited

U.S. PATENT DOCUMENTS

2014/0138589 A1* 5/2014 Hayano .................... C08K 3/04
252/511

FOREIGN PATENT DOCUMENTS

| EP | 1 787 955 A1 | 5/2007 |
| WO | 2006/011655 A1 | 2/2006 |
| WO | 2013/005653 A1 | 1/2013 |

OTHER PUBLICATIONS

Bokobza et al., "Blends of carbon blacks and multiwall carbon nanotubes as reinforcing fillers for hydrocarbon rubbers", Journal of Polymer Science: Part B: Polymer Physics, 2008, vol. 46, pp. 1939-1951, Abstract, (1 page).

(Continued)

*Primary Examiner* — Shane Fang
(74) *Attorney, Agent, or Firm* — Westerman, Hattori, Daniels & Adrian, LLP

(57) ABSTRACT

The present invention is a polyether-based polymer composition includes: a polyether-based polymer including an oxirane monomer unit and having one cationic group substantially only at one terminal of a polymer chain, and a nanocarbon material. The polyether-based polymer composition of the present invention can be suitably used, for example, as a bucky gel or as a master batch for preparing a nanocarbon material aqueous dispersion in which a nanocarbon material is favorably dispersed.

6 Claims, 1 Drawing Sheet

(51) Int. Cl.
*C08G 65/08* (2006.01)
*C08L 71/02* (2006.01)
*G01N 30/00* (2006.01)
*G01R 33/46* (2006.01)

(52) U.S. Cl.
CPC ......... *C08L 71/02* (2013.01); *C08K 2201/011* (2013.01); *G01N 2030/486* (2013.01); *G01R 33/46* (2013.01)

(58) Field of Classification Search
CPC .. C09D 173/02; C12Q 1/6874; C12Q 1/6886; C12Q 2600/118; C12Q 2600/156; C12Q 2600/112
See application file for complete search history.

(56) References Cited

OTHER PUBLICATIONS

Bokobza, "Carbon Nanotubes: Exceptional Reinforcing Fillers for Silicone Rubbers", 2009, vol. 62, No. 3, pp. 112-117, (6 pages).
International Search Report dated May 24, 2016, issued in counterpart International Application No. PCT/JP2016/055846 (2 pages).

* cited by examiner

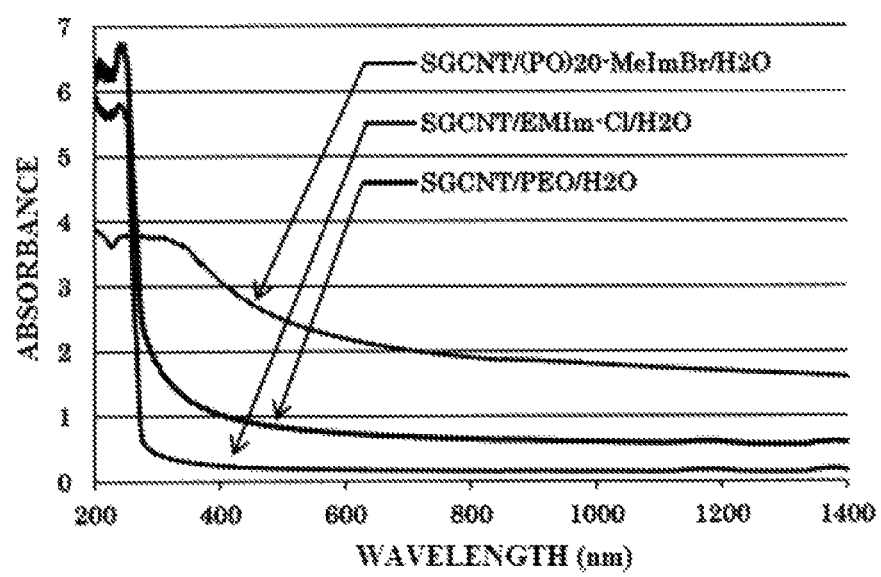

POLYETHER-BASED POLYMER COMPOSITION

TECHNICAL FIELD

The present invention relates to a polyether-based polymer composition in which a nanocarbon material is favorably and stably dispersed in the polyether-based polymer. The polyether-based polymer composition of the present invention can be suitably used, e.g., as a master batch for preparing a nanocarbon material aqueous dispersion in which the nanocarbon material is favorably dispersed.

BACKGROUND ART

Since nanocarbon materials such as carbon nanotubes have excellent electrical properties and further have both excellent thermal conductivity and mechanical strength properties, they are expected to be applied in a wide range of fields. As one of methods for applying nanocarbon materials, blending them into a polymer material has been studied for remarkably improving properties such as electrical conductivity, thermal conductivity and mechanical strength of the polymer material.

For example, in Non-Patent Literature 1, there has been studied the impartment of electrical conductivity to the styrene/butadiene rubber while improving mechanical strength thereof by blending of a multiwall carbon nanotube into the styrene/butadiene rubber. Additionally, in Non-Patent Literature 2, there has been studied the improvement of mechanical strength properties of a poly (dimethylsiloxane) by blending of a multiwall carbon nanotube as a reinforcing material into the poly(dimethylsiloxane).

However, since the nanocarbon material tends to be inferior in affinity for the polymer material, there is a problem that the nanocarbon material is considerably difficult to uniformly disperse in the polymer material.

Thus, as also shown in Non-Patent Literature 1, there were some cases where the properties such as electrical conductivity of the composition obtained by blending the nanocarbon material into the polymer material were hardly different from those of a composition obtained by blending a carbon black into the same polymer material and it was difficult to say that the excellent properties of the nanocarbon material were sufficiently exerted. Therefore, there has been desired the development of a polymer material which easily makes it possible to disperse the nanocarbon material in the composition and thus allows obtaining a composition having a high electrical conductivity.

In order to solve this problem, Patent Literature 1 proposes a composition which includes a polyether-based polymer containing an oxirane monomer unit and in which at least a part of the oxirane monomer unit is an oxirane monomer unit having a cationic group, and a nanocarbon material. In the composition described in this document, the nanocarbon material is favorably dispersed in the polymer material and thereby an excellent electrical conductivity is provided.

CITATION LIST

Patent Literature

Patent Literature 1: WO 2013/005653 (US 2014/0138589)

Non-Patent Literature

Non-Patent Literature 1: Bokobza, and 4 others, "Blends of Carbon Blacks and Multiwall Carbon Nanotubes as Reinforcing Fillers for Hydrocarbon Rubbers", Journal of Polymer Science: Part B: Polymer Physics, 2008, Vol. 46, p. 1939-1951

Non-Patent Literature 2: Bokobza, Rahmani, "Carbon Nanotubes: Exceptional Reinforcing Fillers for Silicone Rubbers", RAW MATERIALS AND APPLICATIONS, 2009, p. 112-117

SUMMARY OF INVENTION

Technical Problem

The object of the present invention is to provide a polyether-based polymer composition which includes a polyether-based polymer and a nanocarbon material and in which the nanocarbon material is more favorably and more stably dispersed in the polyether-based polymer.

Solution to Problem

As a result of intensive studies in order to solve the above problems, the present inventors have found that a nanocarbon material can be favorably and stably dispersed in a polyether-based polymer by blending the nanocarbon material into a polyether-based polymer including an oxirane monomer unit and having one cationic group substantially only at one terminal of the polymer chain, and have completed the present invention.

Thus, one aspect of the invention provides polyether-based polymer compositions of the following [1] to [7].

[1] A polyether-based polymer composition including a polyether-based polymer including an oxirane monomer unit and having one cationic group substantially only at one terminal of a polymer chain, and a nanocarbon material.

[2] The polyether-based polymer composition according to [1], wherein the oxirane monomer unit is a unit represented by the following formula (1):

wherein R represents a nonionic group.

[3] The polyether-based polymer composition according to [2], wherein the polyether-based polymer is a polymer represented by the following formula (2):

wherein R represents a nonionic group, $A^+$ represents a cationic group, $X^-$ represents a counter anion, and n represents an integer of 20 or more.

[4] The polyether-based polymer composition according to [3], wherein R represents a methyl group in the formula (2).

[5] The polyether-based polymer composition according to any of [1] to [4], wherein the nanocarbon material is a carbon nanotube.

[6] The polyether-based polymer composition according to any of [1] to [5], wherein a content of the nanocarbon material is 0.01 to 30 parts by weight based on 100 parts by weight of the polyether-based polymer.

[7] The polyether-based polymer composition according to any of [1] to [6], wherein water is further contained and a content of the nanocarbon material is 0.05 wt % or more based on the whole composition.

Advantageous Effects of Invention

The polyether-based polymer composition of the present invention can be suitably used, e.g., as a bucky gel or as a master batch for preparing a nanocarbon material aqueous dispersion in which a nanocarbon material is favorably dispersed.

BRIEF DESCRIPTION OF DRAWINGS

The FIGURE illustrates visible/near-infrared absorption spectra of a (PO)nMe Im-Br/SGCNT/H$_2$O dispersion, an EMIm-Cl/SGCNT/H$_2$O dispersion and a PEO/SGCNT/H$_2$O dispersion.

DESCRIPTION OF EMBODIMENTS

The polyether-based polymer composition according to one embodiment of the invention includes: a polyether-based polymer including an oxirane monomer unit and having one cationic group substantially only at one terminal of the polymer chain; and a nanocarbon material.
(Polyether-Based Polymer)

The polyether-based polymer constituting the polyether-based polymer composition according to one embodiment of the invention (hereinafter referred to as "polyether-based polymer (A)" in some cases) is a polymer including an oxirane monomer unit and having one cationic group substantially only at one terminal of the polymer chain.

The oxirane monomer unit that can be contained in the polyether-based polymer used in the present invention, is a unit obtained by subjecting an oxirane structure portion of a compound having an oxirane structure to ring-opening polymerization.

The structure of the oxirane monomer unit included in the polyether-based polymer, although not particularly limited, has preferably a repeating unit represented by the following formula (I):

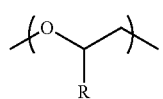

(1)

wherein R represents a nonionic group. The nonionic group is not particularly limited as long as the group is a nonionic group. Examples of the nonionic group include a hydrogen atom; an alkyl group having 1 to 10 carbon atoms such as methyl group, ethyl group, n-propyl group, isopropyl group, n-butyl group, isobutyl group and t-butyl group; an alkenyl group having 2 to 10 carbon atoms such as vinyl group, allyl group and propenyl group; an alkynyl group having 2 to 10 carbon atoms such as ethynyl group and propynyl group; a cycloalkyl group having 3 to 20 carbon atoms such as cyclopropyl group, cyclobutyl group, cyclopentyl group and cyclohexyl group; an aryl group having 6 to 20 carbon atoms such as phenyl group, 1-naphthyl group and 2-naphthyl group; and the like.

In the R, the alkyl group having 1 to 10 carbon atoms, the alkenyl group having 2 to 10 carbon atoms, the alkynyl group having 2 to 10 carbon atoms, the cycloalkyl group having 3 to 20 carbon atoms, and the aryl group having 6 to 20 carbon atoms may have a substituent at an arbitrary position.

Examples of the substituent include an alkyl group having 1 to 6 carbon atoms such as methyl group and ethyl group; an alkoxy group having 1 to 6 carbon atoms such as methoxy group, ethoxy group, isopropoxy group and allyloxy group; an aryl group that may have a substituent, such as phenyl group, 4-methylphenyl group, 2-chlorophenyl group and 3-methoxyphenyl group; a halogen atom such as fluorine atom, chlorine atom and bromine atom; an alkylcarbonyl group having 1 to 6 carbon atoms such as methylcarbonyl group and ethylcarbonyl group; a (meth)acryloyl group such as acryloyl group and methacryloyl group; and the like.

As the R, a hydrogen atom or an alkyl group having 1 to 6 carbon atoms is preferable, and a methyl group is particularly preferable.

Specific examples of the oxirane monomer unit include, although not limited to, an alkylene oxide monomer unit such as ethylene oxide unit, propylene oxide unit and 1,2-butylene oxide unit; an alkenyl group-containing oxirane monomer unit such as allylglycidyl ether unit; an acryloyl group-containing oxirane monomer unit such as glycidyl acrylate unit; a halogen group-containing oxirane monomer unit such as epichlorohydrin unit; and the like.

The polyether-based polymer used in the present invention may include one type of oxirane monomer unit or two or more types of oxirane monomer units.

When the polyether-based polymer used in the present invention is a copolymer having two or more types of oxirane monomer units, its type is not particularly limited, and may be a block copolymer or a random copolymer.

In addition, the chain structure of the polyether-based polymer is not particularly limited, and may be in a linear shape or in a chain structure having a branch such as a graft shape and a radial shape.

In the polyether-based polymer (A), the content of the oxirane monomer unit is preferably 95 wt % or more, more preferably 96 wt % or more and even more preferably 97 wt % or more in the whole monomer units, and particularly preferably, the polyether-based polymer (A) includes only an oxirane monomer unit.

In addition, the polyether-based polymer (A) may have a structural unit derived from a monomer having an anionic polymerizability other than an oxirane monomer unit. Examples of such a monomer unit include a structural unit derived from an aromatic vinyl monomer, such as styrene, α-methylstyrene, 4-methylstyrene, 4-ethylstyrene, 4-t-butylstyrene, 4-vinylstyrene, 4-vinyltoluene, 1,2-diphenylethylene and 1,1-diphenylethylene; a structural unit derived from a conjugated diene monomer, such as 1,3-butadiene, 1,3-pentadiene, 1,3-hexadiene, 2,3-dimethylbutadiene and isoprene; and the like.

The polyether-based polymer (A) may have two or more types of structural units derived from these monomers.

In the polyether-based polymer (A), the content of the structural unit derived from the monomer having anionic polymerizability other than the oxirane monomer unit is normally 5 wt % or less, preferably 4 wt % or less, and more preferably 3 wt % or less based on the whole monomer units.

The polyether-based polymer (A) is a polymer having one cationic group substantially only at one terminal of the polymer chain. Herein, "having one cationic group substantially only at one terminal of the polymer chain" means that the polyether-based polymer used in the present invention may have a cationic group not only at one terminal of the polymer chain but also at an arbitrary position of the polymer, as long as the effects of the present invention are not inhibited.

In the polyether-based polymer used in the present invention, a state where the cationic group binds to only one molecular terminal of the polymer chain including the oxirane monomer unit can be confirmed, e.g., by measuring $^1$H-NMR, and quantitatively assigning both terminal functional groups.

The cationic group included in the polyether-based polymer (A) is not particularly limited. From the viewpoint of obtaining a polyether-based polymer composition that particularly includes a nanocarbon material having excellent dispersibility, the cationic group is preferably a cationic group in which an atom of Group 15 or 16 in the periodic table forms an onium cation structure, more preferably a cationic group in which a nitrogen atom forms an onium cation structure, even more preferably a cationic group in which a nitrogen atom in a nitrogen atom-containing aromatic heterocyclic ring forms an onium cation structure, and particularly preferably a cationic group in which a nitrogen atom in an imidazolium ring forms an onium cation structure.

The cationic group is a group having an onium cation structure. Specific examples of the cationic group include, although not limited to, an ammonium group; a monosubstituted ammonium group such as methylammonium group, butylammonium group, cyclohexylammonium group, anilinium group, benzylammonium group and ethanolammonium group; a disubstituted ammonium group such as dimethylammonium group, diethylammonium group, dibutylammonium group and nonylphenylammonium group; a trisubstituted ammonium group such as trimethylammonium group, triethylammonium group, n-butyldimethylammonium group, stearyldimethylammonium group, tributylammonium group, trivinylammonium group, triethanolammonium group, N,N-dimethylethanolammonium group and tri(2-ethoxyethyl)ammonium group; a group including a heterocyclic ring containing a cationic nitrogen atom, such as piperidinium group, 1-pyrrolidinium group, imidazolium group, 1-methylimidazolium group, 1-ethylimidazolium group, benzimidazolium group, pyrrolium group, 1-methylpyrrolium group, oxazolium group, benzoxazolium group, pyrazolium group, isoxazolium group, pyridinium group, 2,6-dimethylpyridinium group, pyrazinium group, pyrimidinium group, pyridazinium group, triazinium group, N,N-dimethylanilinium group, quinolinium group, isoquinolinium group, indolinium group, quinoxalium group and iso-quinoxalium group; a group including a cationic phosphorus atom, such as triphenylphosphonium group and tributylphosphonium group; and the like. Among them, the group including a heterocyclic ring containing a cationic nitrogen atom, such as imidazolium group, 1-methylimidazolium group, 1-ethylimidazolium group and benzimidazolium group is preferable.

In addition, the cationic group normally has a counter anion, but the kind of the counter anion is not particularly limited. Examples of the counter anion include a halide ion such as Cl$^-$, Br$^-$ and I$^-$, a sulfonimide ion such as (FSO$_2$)$_2$N$^-$, (CF$_3$SO$_2$)$_2$N$^-$ and (CF$_3$CF$_2$SO$_2$)$_2$N$^-$, as well as OH$^-$, SCN$^-$, BF$_4^-$, PF$_6^-$, ClO$_4^-$, CH$_3$SO$_3^-$, CF$_3$SO$_3^-$, CF$_3$COO$^-$, PhCOO$^-$ and the like.

Among them, from the viewpoint of obtaining a polyether polymer composition that includes a nanocarbon material particularly having excellent dispersibility, a halide ion or a sulfonimide ion is preferable.

The polyether-based polymer (A) is a polymer having one cationic group substantially only at one terminal of the polymer chain, but a group which binds to the one terminal on the side having no cationic group is not particularly limited. Examples of the group include a hydrogen atom, an alkyl group having 1 to 6 carbon atoms, an alkylsilyl group having 1 to 6 carbon atoms, an alkoxy group having 1 to 6 carbon atoms, and the like, and the hydrogen atom is preferable.

The number average molecular weight of the polyether-based polymer (A) is not particularly limited, but is normally 500 to 2,000,000, preferably 750 to 1,500,000, more preferably 1,000 to 1,000,000, and even more preferably 1,000 to 30,000. If the number average molecular weight of the polyether-based polymer is too high, the forming processability of the resulting composition may be inferior, and if the number average molecular weight is too low, the mechanical strength of the resulting composition may be insufficient.

In the present invention, the polyether-based polymer (A) is particularly preferably a group represented by the following (2):

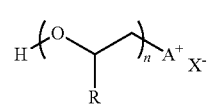

(2)

wherein R represents a nonionic group, A$^+$ represents a cationic group, X$^-$ represents a counter anion, and n represents an integer of 20 or more.

Note that the nonionic group, the cationic group and the counter anion are exemplified by those described above.

In addition, n represents an integer of 20 or more, and the upper limit is not particularly limited, but is preferably 500 or less.

(Method of Synthesizing Polyether-Based Polymer (A))

The method of synthesizing the polyether-based polymer (A) used in the present invention is not particularly limited, and an arbitrary method of synthesizing can be adopted as long as the desired polyether-based polymer can be obtained. Particularly, from the viewpoint of more easily obtaining a desired polyether-based polymer, a method of synthesizing having a step (I) of obtaining the polyether-based polymer (B) including an oxirane monomer unit and having a halogen atom (halogen group) at one terminal of the polymer chain, and a step (II) of obtaining a polyether-based polymer having an onium halide structure by converting the halogen group on the one terminal of the polymer chain into an onium halide structure-containing group by reacting an onium-forming agent with the resulting polyether-based polymer (B) (quaternization reaction), is preferred. Herein, the polyether-based polymer (B) is a precursor of the polyether-based polymer used in the present invention.

(Step (I))

Step (I) is a step of obtaining the polyether-based polymer (B) including an oxirane monomer unit and having a halogen atom (halogen group) at one terminal of the polymer chain. More specifically, in step (I), the polyether-based polymer (B) including an oxirane monomer unit and having a halogen atom (halogen group) at one terminal of the polymer chain is obtained by polymerization reaction of the oxirane monomer in the presence of a catalyst composition prepared from an organoaluminum compound and a quaternary ammonium halide compound in an inert solvent.

The oxirane monomer to be used is a compound having a 3-membered ring ether structure in its molecule. Examples of the compound include a compound represented by the following formula (3):

(3)

In the formula (3), R means the same group as the R in the general formula (1), and a similar exemplification can be made.

Specific examples of the oxirane monomer to be used include an alkylene oxide, such as ethylene oxide, propylene oxide, 1,2-epoxybutane, 1,2-epoxy-isobutane, 2,3-epoxybutane, 1,2-epoxyhexane, 1,2-epoxyoctane, 1,2-epoxydecane, 1,2-epoxytetradecane, 1,2-epoxyhexadecane, 1,2-epoxyoctadecane, 1,2-epoxyeicosane, 1,2-epoxycyclopentane, 1,2-epoxycyclohexane and 1,2-epoxycyclododecane;
a cyclic fatty acid epoxide, such as cyclohexene oxide;
a halogen-containing epoxide, such as epifluorohydrin and epichlorohydrin;
an alkylglycidyl ether, such as methylglycidyl ether, ethylglycidyl ether and butylglycidyl ether;
a non-ethylenic unsaturated epoxide, such as styrene oxide and phenylglycidyl ether;
an ethylenic unsaturated glycidyl ethers, such as vinylglycidyl ether, allylglycidyl ether, butenylglycidyl ether and o-allylphenylglycidyl ether;
a monoepoxide of a diene or a polyene, such as butadiene monoepoxide,
4,5-epoxy-2-pentene and 1,2-epoxy-5,9-cyclododecadiene;
an alkenyl epoxide, such as 3,4-epoxy-1-butene, 1,2-epoxy-5-hexene and 1,2-epoxy-9-decene;
a glycidyl ester of the ethylenic unsaturated carboxylic acid, such as glycidyl acrylate, glycidyl methacrylate, glycidyl crotonate, glycidyl-4-heptenoate, glycidyl sorbate, glycidyl linoleate, glycidyl-4-methyl-3-pentenoate, glycidyl ester of 3-cyclohexenecarboxylic acid, and glycidyl ester of 4-methyl-3-cyclohexenecarboxylic acid; and the like.

In addition, in the present invention, a branched structure can be introduced into the polymer by copolymerizing a diepoxy monomer, such as butadiene dioxide, ethyleneglycol diglycidyl ether; polyethyleneglycol diglycidyl ether and vinyl cyclohexene dioxide. These diepoxy monomers may be used in combination of two or more kinds.

Furthermore, in the present invention, a monomer having an anionic polymerizability other than the oxirane monomer can be used in combination. Examples of such a monomer include an aromatic vinyl monomer, such as styrene, α-methylstyrene, p-methylstyrene, ethylstyrene, t-butylstyrene, vinylstyrene, vinyltoluene, 1,2-diphenylmethylene and 1,1-diphenylmethylene, as well as a conjugated diene monomer such as 1,3-butadiene, 1,3-pentadiene, 1,3-hexadiene, 2,3-dimethylbutadiene and isoprene. These monomers may be used in combination of two or more kinds.

In the present invention, the oxirane monomers as described above may be used either alone or in combination of two or more kinds. In the method of producing a polyether-based polymer used in the present invention, the polymerization reaction proceeds in association with living-ness, and thus, in the case of obtaining a copolymer by using two or more monomers, its bonding mode can be controlled, for example, a random copolymer can be obtained by performing polymerization reaction while two or more monomers coexist, and a block copolymer can also be obtained through polymerization reaction by sequentially adding two or more monomers.

The catalyst composition used in the present invention is prepared from an organoaluminum compound and a quaternary ammonium halide compound.

Examples of the organoaluminum compound used in the present invention include a trialkylaluminum compound such as trimethylaluminum, triethylaluminum, triisobutylaluminum and tri-n-octylaluminum;
a tricycloalkylaluminum compound, such as tricyclopentylaluminum and tricyclohexylaluminum;
a triarylaluminum compound, such as triphenylaluminum;
a dialkylaluminum hydride, such as dimethylaluminum hydride and diethylaluminum hydride;
a dialkylaluminum halide, such as dimethylaluminum chloride and diethylaluminum chloride;
a monoalkylaluminum dihalide, such as methylaluminum dichloride and ethylaluminum dichloride;
a dialkylaluminum alkoxide, such as dimethylaluminum methoxide, dimethylaluminum diethoxide and diethylaluminum methoxide;
a monoalkylaluminum dialkoxide, such as methylaluminum dimethoxide and ethylaluminum diethoxide; and the like.

Among them, the trialkylaluminum, such as trimethylaluminum, triethylaluminum, triisobutylaluminum and tri-n-octylaluminum is preferable, because it can provide the desired polyether-based polymer with a higher yield.

Examples of the quaternary ammonium halide compound used in the present invention include a tetra-$C_{1-20}$-alkyl ammonium halide, such as tetramethylammonium chloride, tetramethylammonium bromide, tetrabutylammonium chloride and tetrabutylammonium bromide;
a mono-$C_{1-4}$-alkyl-tri-$C_{6-20}$alkylammonium halide, such as methyltrioctylammonium chloride and methyltri(decyl)ammonium chloride,
an aralkyltrialkylammonium salt, such as benzyltrimethylammonium chloride; and the like.

They can be used either alone or in combination of two or more kinds.

Among them, tetra-$C_{1-10}$alkylammonium halide and mono-$C_{1-2}$alkyl-tri-$C_{7-16}$alkylammonium halide are preferable, tetra-$C_{1-6}$alkylammonium halide is more preferable, and tetra-$C_{1-6}$alkylammonium bromide is even more preferable.

When obtaining the catalyst composition from the organoaluminum compound and the quaternary ammonium halide compound, the use amount of each component may be determined depending on the molecular weight and the like of the desired polymer and is not particularly limited, but the amount of the quaternary ammonium halide is preferably 0.1 to 10 mol, more preferably 0.3 to 5 mol, and further preferably within the range of 0.5 to 3 mol based on 1 mol of the organoaluminum compound.

The catalyst composition can be prepared by dissolving or suspending these components in a suitable inert solvent and mixing them. The method of mixing the organoaluminum compound and the quaternary ammonium halide compound is not particularly limited, and examples of the method include a method of adding a quaternary ammonium halide compound to a solution containing an organoaluminum compound and mixing them, a method of adding an organoaluminum compound to a solution containing a quaternary ammonium halide compound and mixing them, a method of preparing both an organoaluminum compound and a quaternary ammonium halide compound as solutions respectively and mixing them, and the like.

The solvent to be used is not particularly limited as long as it is inert. Examples of the solvent include an aromatic hydrocarbon-based solvent such as benzene and toluene; a chain saturated hydrocarbon-based solvent such as n-pentane and n-hexane; an alicyclic hydrocarbon-based solvent such as cyclopentane and cyclohexane; an ether-based solvent such as tetrahydrofuran, anisole and diethyl ether; or a mixed solvent thereof; and the like.

The temperature and time for mixing these components are also not particularly limited, but the compounds are preferably mixed normally under a condition of −30 to +50° C. for 10 seconds to 12 hours.

When monomers including an oxirane monomer are polymerized in the presence of a catalyst composition, a method of mixing the catalyst composition and the monomers is also not particularly limited. For example, a monomer may be added to a solvent containing a catalyst composition, or a catalyst composition may be added to a solvent containing a monomer.

The polymerization mode is also not particularly limited, but it is preferable to perform polymerization by a solution polymerization method, from the viewpoint of sufficiently controlling the polymerization.

The solvent used in the polymerization reaction is not particularly limited as long as it is an inert solvent. Examples of the solvent include aromatic hydrocarbons such as benzene and toluene; chain saturated hydrocarbons such as n-pentane and n-hexane; alicyclic hydrocarbons such as cyclopentane and cyclohexane; ethers such as tetrahydrofuran, anisole and diethyl ether, or alternatively a mixed solvent thereof; and the like. Among these solvents, a nonpolar solvent such as aromatic hydrocarbon, chain saturated hydrocarbon and alicyclic hydrocarbon is preferable because it promotes the polymerization reaction rate.

Polymerization is preferably performed in the presence of an inert gas atmosphere of nitrogen, helium, argon or the like.

The condition for polymerization is not particularly limited, and may be determined depending on a type of a monomer and a catalyst to be used, a molecular weight of a desired polymer, and the like.

The pressure during polymerization is normally 1 to 500 atm, preferably 1 to 100 atm, and particularly preferably 1 to 50 atm.

The temperature during polymerization is normally −70 to +200° C., preferably −40 to +150° C., and particularly preferably −20 to +100° C.

Depending on the reaction scale, the polymerization time is normally 10 seconds to 100 hours, preferably 20 seconds to 80 hours and particularly preferably 30 seconds to 50 hours.

After completion of the polymerization reaction, the desired polyether-based polymer (B) can be isolated by conducting a post-treatment operation of the polymerization reaction mixture by an ordinary method. For example, a small amount of a reaction terminator (alcohols such as methanol, ethanol and isopropyl alcohol) may be added to the polymerization reaction solution to terminate the polymerization reaction, and the resulting polymerization reaction mixture may be washed with an aqueous solution of a dilute acid (such as dilute hydrochloric acid) to decarburize the catalyst residue, and furthermore washed with ion-exchanged water, and then the organic layer may be dried under reduced pressure at 50° C. for 12 hours to isolate the desired polyether-based polymer (B).

(Step (II))

The step (II) is a step of reacting the polyether-based polymer (B) obtained in the step (I) with an onium-forming agent (quaternization reaction), and thereby converting a halogen group at one terminal of the polymer chain into an onium halide structure-containing group to obtain a polyether-based polymer containing an onium halide structure.

Specific examples of the onium-forming agent to be used include, but are not limited to, ammonia; a monosubstituted amine such as methylamine, butylamine, cyclohexylamine, aniline, benzylamine and ethanolamine; a disubstituted amine such as dimethylamine, diethylamine, dibutylamine and nonylphenylamine; a trisubstituted amine such as trimethylamine, triethylamine, n-butyldimethylamine, n-octyldimethylamine, n-stearyldimethylamine, tributylamine, trivinylamine, triethanolamine, N,N-dimethylethanolamine, tri(2-ethoxyethyl)amine and N,N-dimethylaniline; a heterocyclic compound containing nitrogen atom, such as piperidine, 1-pyrrolidine, imidazole, 1-methylimidazole, 1-ethylimidazole, pyrrole, 1-methylpyrrole, oxazole, isoxazole, benzimidazole, benzoxazole, benzisoxazole, pyrazole, pyridine, 2,6-dimethylpyridine, pyrazine, pyrimidine, pyridazine, triazine, quinoline, isoquinoline, indole, isoindole, quinoxaline and thiazole; and a phosphorus compound such as triphenylphosphine and tributylphosphine.

Among them, the heterocyclic compound containing nitrogen atom, such as imidazole, 1-methylimidazole, 1-ethylimidazole and benzimidazole, and a trisubstituted amine such as n-butyldimethylamine, n-octyldimethylamine and n-stearyldimethylamine are preferable.

The method of mixing the polyether-based polymer (B) and the onium-forming agent is not particularly limited, and examples of the method include a method of adding an onium-forming agent to a solution containing a polyether-based polymer, and mixing them, a method of adding a polyether-based polymer to a solution containing an onium-forming agent and mixing them, a method of preparing both an onium-forming agent and a polyether-based polymer as solutions respectively, and mixing both solutions, and the like.

The solvent is not particularly limited as long as it is an inert solvent, and the solvent may be a nonpolar solvent or a polar solvent.

Examples of the nonpolar solvent include an aromatic hydrocarbon such as benzene and toluene; a chain saturated hydrocarbon such as n-pentane and n-hexane; an alicyclic saturated hydrocarbon such as cyclopentane and cyclohexane.

Examples of the polar solvent include ethers such as tetrahydrofuran, anisole and diethyl ether; esters such as ethyl acetate and ethyl benzoate; a ketone such as acetone, 2-butanone and acetophenone; an aprotic polar solvent such as acetonitrile, dimethylacetamide, N,N-dimethylformamide and dimethylsulfoxide; a protonic polar solvent such as ethanol, methanol and water; a mixed solvent composed of two or more thereof; and the like.

The use amount of the onium-forming agent is not particularly limited, and may be determined depending on the content ratio of the halogen group at the polymer chain terminal of the desired polyether-based polymer.

Specifically, the use amount of the onium-forming agent is normally within the range of 0.01 to 100 mol, preferably 0.02 to 50 mol, more preferably 0.03 to 10 mol, and even more preferably 0.05 to 2 mol, based on 1 mol of the halogen group at the polymer chain terminal of the polyether-based polymer to be used.

The pressure at the time of reacting the polyether-based polymer (B) and the onium-forming agent is not particularly limited, but is normally 1 to 500 atm, preferably 1 to 100 atm, and particularly preferably 1 to 50 atm.

The temperature during the reaction is also not particularly limited, and is normally 0 to 200° C., preferably 20 to 170° C., and more preferably 40 to 150° C.

The reaction time is normally 1 minute to 1,000 hours, preferably 3 minutes to 800 hours, more preferably 5 minutes to 500 hours, and further preferably 30 minutes to 200 hours.

The polyether-based polymer used in the present invention obtained as above can be directly used as a component of the polyether-based polymer composition according to one embodiment of the invention.

Furthermore, in the present invention, as necessary, a metal compound may be brought into contact with a polyether-based polymer containing an onium halide structure to thereby convert at least a part of the halide ion that is a counter anion of the onium halide structure into another anion.

The metal compound used in the anion exchange reaction is not particularly limited, but an alkali metal compound or an alkaline earth metal compound having an anion to be introduced is suitable.

Conditions for the anion exchange reaction are not particularly limited, and only the polyether-based polymer and the metal compound may be mixed, or they may be mixed in the presence of other compounds such as organic solvents. In addition, the use amount of the metal compound is not particularly limited, but is normally within the range of 0.01 to 100 mol, preferably 0.02 to 50 mol, and more preferably 0.03 to 10 mol, based on 1 mol of the onium halide structure included in the polyether-based polymer to be used.

The pressure at the time of the anion exchange reaction is normally 1 to 150 atm, preferably 1 to 100 atm, and particularly preferably 1 to 50 atm.

The temperature during the reaction is normally −30 to +200° C. preferably −15 to +180° C., and more preferably 0 to 150° C. The reaction time is normally 1 minute to 1000 hours, preferably 3 minutes to 100 hours, more preferably 5 minutes to 10 hours, and further preferably 5 minutes to 3 hours.

After completion of the anion exchange reaction, the desired polyether-based polymer may be recovered according to an ordinary method such as reduced pressure drying. The polyether-based polymer (A) obtained as described above has excellent dispersion power relative to the nanocarbon material.

The polyether-based polymer (A) has the number average molecular weight as described above, and when the number average molecular weight is within the above range, a composition having excellent processability and mechanical strength can be obtained.

An HLB value (hydrophile-lipophile balance) of the polyether-based polymer (A) is normally 0.5 to 10, preferably 1 to 8, and more preferably 2 to 7. The HLB value can be determined by the calculation formula described below:

$$HLB = 7 + 11.7 \log(Mw/Mo)$$

(wherein Mw represents the sum of the molecular weights of the hydrophilic part, and Mo represents the sum of the molecular weights of the lipophilic part.)

In addition, for the polyether-based polymer (A), a ratio of the number of cationic groups in the polymer chain relative to the repeating number (corresponding to the number n in formula (2)) of the oxirane monomer unit constituting the polyether-based polymer (the number of the cationic groups/the repeating number of the oxirane monomer unit) is preferably 1/20 or less. With such a ratio, the nanocarbon material can be more favorably and stably dispersed in the polyether-based polymer.

(Nanocarbon Material)

The polyether-based polymer composition according to one embodiment of the invention can be obtained by blending a nanocarbon material into the polyether-based polymer obtained as described above.

Examples of the nanocarbon materials that can be used in the present invention include a graphene sheet, a carbon nanotube, a carbon nanohorn, a nanographene and the like, and among them, the carbon nanotube is particularly preferably used.

The carbon nanotube is a nanocarbon material which has a tubelar-shaped graphene sheet. The carbon nanotubes are roughly classified into single-wall nanotubes and multiwall nanotubes depending on the configuration number of its peripheral walls. In addition, the classification based on the differences in the structures of the graphene sheets includes a chiral type, a zigzag type, an armchair type and the like. In the present invention, any type of the carbon nanotubes can be used as a nanocarbon material. Among them, a single-wall carbon nanotube obtained by a super growth method and known to have a high aspect ratio (a single-wall carbon nanotube obtained according to the method disclosed in WO 2006/011655) is particularly preferably used.

In the polyether-based polymer composition according to one embodiment of the invention, the content ratio between the polyether-based polymer (A) and the nanocarbon material is not particularly limited, but, from the viewpoint of favorably dispersing the nanocarbon material to efficiently obtain a composition having excellent electrical conductivity, the content of the nanocarbon material is preferably 0.01 to 30 parts by weight and more preferably 0.02 to 20 parts by weight, based on 100 parts by weight of the polyether-based polymer.

When obtaining the polyether-based polymer composition according to one embodiment of the invention, the method of mixing the polyether-based polymer (A) and the nanocarbon material is not particularly limited, but it is preferable that they are mixed by combining a step of subdividing the nanocarbon material and a step of mixing the nanocarbon material and the polyether-based polymer.

The nanocarbon material may be subdivided by adopting a known subdivision method such as a method of applying a shear force by a mill or a kneader, and a subdividing method by an ultrasonic wave, and is not particularly limited. Note that the order of the step of subdividing the nanocarbon material and the step of mixing the nanocarbon material and the polyether-based polymer is not particularly limited. After subdividing the nanocarbon material, the subdivided nanocarbon material and the polyether-based polymer may be mixed by a method as described below, or otherwise, after mixing the nanocarbon material and the polyether-based polymer by a method as described below to obtain a composition, the subdivision step may be applied to the composition to subdivide the nanocarbon material.

In the step of mixing the nanocarbon material and the polyether-based polymer (A), the specific method of mixing is not particularly limited, but it is preferable to mix these components in a solvent. When the mixing is carried out in a solvent, the solvent to be used is not particularly limited, but a polar solvent is preferably used from the viewpoint of obtaining a composition in which the nanocarbon material is more favorably dispersed.

Examples of the polar solvent include an ether-based solvent such as tetrahydrofuran and anisole; an ester-based solvent such as ethyl acetate and ethyl benzoate; a ketone-based solvent such as acetone, 2-butanone and acetophenone; an amide-based solvent such as N,N-dimethylformamide and N-methylpyrrolidone; a nitrile-based solvent such as acetonitrile and propionitrile; a sulfur-containing solvent such as dimethylsulfoxide and sulfolane; a protonic polar solvent such as ethanol, methanol and water; and the like. Each of these solvents may be used alone, or may be used as a mixed solvent of two or more kinds.

The use amount of the solvent is not particularly limited, but is preferably selected so that each concentration of the nanocarbon material and the polyether-based polymer in a solvent is within a range of 0.01 to 50 wt %.

The method of mixing the nanocarbon material and the polyether-based polymer (A) in a solvent is not particularly limited. Examples of the method include a method in which the polyether-based polymer is added to a solution containing a suspended nanocarbon material and mixed, a method in which the nanocarbon material is added to a solution of the polyether-based polymer dissolved in the solvent and mixed, and the like. The mixing may be carried out by using a common stirrer or by using an ultrasonic dispersing device.

Although the solution obtained by mixing can be directly used as the polyether-based polymer composition according to one embodiment of the invention, it is preferably used as a solid polyether-based polymer composition by removing the solvent. The method of removing the solvent is not particularly limited, and e.g., evaporative removal or solidification drying may be carried out.

One aspect of the polyether-based polymer composition according to the invention is an aqueous dispersion a containing the nanocarbon material. The nanocarbon material content in the aqueous dispersion a is preferably 0.01 wt % or more, and more preferably 0.05 wt % or more based on the whole composition. In addition, the upper limit of the nanocarbon material content in the aqueous dispersion a is preferably 0.1 wt %.

The aqueous dispersion a is suitably used as a master batch for preparing an aqueous dispersion of a favorably dispersed nanocarbon material.

It is sufficient that the aqueous dispersion contains 50 wt % or more of water based on the whole solvent, and may contain a hydrophilic organic solvent.

Examples of the hydrophilic organic solvent include alcohols such as methyl alcohol, ethyl alcohol and propyl alcohol; ketones such as acetone and methylethylketone; ethers such as tetrahydrofuran, dioxane and diglyme; amides such as N,N-dimethylformamide, N,N-dimethylacetoamide, N-methyl-2-pyrrolidone and 1,3-dimethyl-2-imidazolidinone; a sulfur-containing solvent such as dimethylsulfoxide and sulfolane; and the like. These solvents may be used either alone or in combination of two or more kinds.

The aqueous dispersion a can be obtained by mixing, e.g., a nanocarbon material, a polyether-based polymer, and, as necessary, other components described below, in water or a water-containing mixed solvent to disperse the nanocarbon material.

The polyether-based polymer composition according to one embodiment of the invention may be a composition including only the nanocarbon material and the polyether-based polymer (A), or may be the aqueous dispersion a, but furthermore may include other components.

Examples of other components that can be contained in the polyether-based polymer composition according to one embodiment of the invention include polymer materials other than the polyether-based polymer (A); carbon; an inorganic oxide such as silica, titania and alumina; a metal particulate such as gold, silver, platinum, nickel, steel and aluminum; an inorganic fiber such as glass fiber and carbon fiber; and the like.

In addition, a crosslinkable composition can be prepared by containing a crosslinking agent and, as necessary, a crosslinking aid or a crosslinking accelerator. The polyether-based polymer composition according to one embodiment of the invention is prepared as a crosslinkable composition, and crosslinked to form a crosslinked product, so that the mechanical strength as a structural material can be substantially improved while maintaining the extremely excellent electrical conductivity of the polyether-based polymer composition according to one embodiment of the invention.

The polymer materials other than the polyether-based polymer (A) that may be blended into the composition according to one embodiment of the invention, are not particularly limited. Examples of the polymer materials include a polyether-based polymer other than the polyether-based polymer (A); a rubber material, such as NBR, SBR, BRIR, acrylic rubber and EPR; a thermoplastic elastomer material, such as SIS, SBS and SEBS; a resin material, such as PMMA, polyethylene, polypropylene, polystyrene, polycarbonate, ABS, vinyl chloride and PET; a photosetting or thermosetting resin, such as epoxy resin, urethane resin and thermosetting/photosetting acrylic resin; and the like.

In addition, the nanocarbon material can be favorably dispersed in the polyether-based polymer composition according to one embodiment of the invention, even if a polymer material that originally has poor affinity with nanocarbon materials is blended. Although the reason is not necessarily clear, the reason may be that the polyether-based polymer fulfills a function of a so-called binder since the polyether-based polymer (A) used as an essential component in the present invention has excellent affinity with both the nanocarbon material and the polymer material.

The crosslinking agent which can be blended when the polyether-based polymer composition according to one embodiment of the invention is prepared as a crosslinkable composition, may be selected depending on the structure of the polymer to be used and the like. Examples of the crosslinking agent include, although not limited to, sulfur such as powdery sulfur, precipitated sulfur, colloidal sulfur, insoluble sulfur and highly-dispersible sulfur; a sulfur-containing compound, such as sulfur monochloride, sulfur dichloride, morpholine disulfide, alkylphenol, disulfide, dibenzothiazyl disulfide, N,N-dithiobis(hexahydro-2H-azenopin-2), phosphorus-containing polysulfide and polymeric polysulfide; an organic peroxide, such as dicumyl peroxide and ditertiary butylperoxide; a quinone dioxime, such as p-quinone dioxime and p,p'-dibenzoyl quinone dioxime; an organic polyamine compound, such as a triethylene tetramine, hexamethylene diamine carbamate, 4,4'-methylenebis-o-chloroaniline and trimercaptotriazine; an alkylphenol resin having a methylol group; and the like.

Among them, sulfur or the sulfur-containing compound is preferable. Each of these crosslinking agents can be used alone or in combination. The blending ratio of the crosslinking agent is not particularly limited, but is preferably 0.1 to 10 parts by weight, more preferably 0.2 to 7 parts by weight, and particularly preferably 0.3 to 5 parts by weight based on 100 parts by weight of the whole composition.

When sulfur or a sulfur-containing compound is used as a crosslinking agent, a crosslinking aid and a crosslinking accelerator are preferably used in combination. The crosslinking aid is not particularly limited, but its examples include zinc white, stearic acid and the like. The crosslinking accelerator is not particularly limited, but each crosslinking accelerator of e.g. a guanidine type, an aldehyde amine type, an aldehyde ammonia type, a thiazole type, a sulfenamide type, a thiourea type, a thiuram type or the like can be used.

Each of the crosslinking aid and the crosslinking accelerator may be used in combination.

The use amount of the crosslinking aid and the crosslinking accelerator is not particularly limited, but is preferably 0.01 to 15 parts by weight, and more preferably 0.1 to 10 parts by weight based on 100 parts by weight of the whole composition.

In the polyether-based polymer composition according to one embodiment of the invention as described above, the nanocarbon material can be favorably dispersed in the polyether-based polymer, thereby exhibiting extremely excellent electrical conductivity. Thus, the polyether-based polymer composition according to one embodiment of the invention can be suitably used as various materials for electric/electronic products, building materials, medical materials and the like.

EXAMPLES

Hereinafter, the present invention will be described more specifically with reference to examples and comparative examples.

The measurement and evaluation in each example were carried out by the following methods.

(1) Measurement of Molecular Weight and Molecular Weight Distribution of the Polyether-Based Polymers (A) and (B)

The molecular weight was measured as a value expressed in terms of polystyrene by gel permeation chromatography (GPC) by using N,N-dimethylformamide as a solvent.

HLC-8320 (manufactured by Tosoh Corporation) was used as a measuring instrument, two TSKgel α-M (manufactured by Tosoh Corporation) were used as a column so that they are serially connected to each other, and a differential refractometer RI-8320 (manufactured by Tosoh Corporation) was used as a detector.

(2) Structural Analysis of Polyether-Based Polymers (A) and (B)

The structures of the polyether-based polymers (A) and (B) were measured as below using a nuclear magnetic resonance apparatus (NMR). 30 mg of the polyether-based polymer was added to 1.0 mL of deuterated chloroform, homogeneously dissolved by shaking for 1 hour, and then $^1$H-NMR measurement was carried out by NMR (manufactured by Bruker Corporation, 500 MHz).

(3) Evaluation of SGCNT Dispersion State

The SGCNT dispersion state of a super-growth single-wall carbon nanotube (single-wall carbon nanotube manufactured according to the method disclosed in WO 2006/011655, hereinafter abbreviated as "SGCNT") in a dispersion composition was evaluated as below.

(i) Composition of SGCNT and polyether-based polymer (A) containing no water (hereinafter referred to as bucky gel)

The composition was centrifuged in a centrifuge of 3000 rotations/minute for 30 minutes, visually observed, and evaluated according to the following evaluation criteria depending on the presence or absence of bleed-out.

[Evaluation Criteria]

Good: There are no change in dispersion state, and no bleed-out

Bad: The SGCNT is separated from other components, and bleed-out is recognized (ii) Composition of SGCNT and polyether-based polymer (A) containing water (hereinafter referred to as aqueous dispersion)

An absorbance at a wavelength of 500 nm was measured by a visible/near-infrared absorption spectrum (measuring apparatus: V-670 manufactured by JASCO Corporation), and the dispersion state was evaluated according to the following evaluation criteria.

[Evaluation Criteria]

Good: Absorbance of 1.5 or higher

Bad: Absorbance lower than 1.0

Production Example 1

(1) Living Anionic Polymerization of Propylene Oxide 2.56 g (8 mmol) of tetra-n-butylammonium bromide and 50 ml of toluene were added to a glass reactor equipped with a stirrer whose inner atmosphere had been replaced with argon, and cooled to 0° C. Subsequently, a solution prepared by dissolving 1.37 g (12 mmol) of triethylaluminum in 10 ml of toluene was added, and the whole content was stirred at 0° C. for 15 minutes to obtain a catalyst composition. 10 g of propylene oxide was added to the resulting catalyst composition, and polymerization reaction was carried out at 0° C. for 2 hours. After the start of the polymerization reaction, the viscosity of the solution slowly increased. After completion of the reaction, a small amount of isopropyl alcohol was poured into the polymerization reaction solution to terminate the reaction. The resulting polymerization reaction solution was washed with a 0.1 N of hydrochloric acid aqueous solution to decalcify the catalyst residue, furthermore washed with ion-exchanged water, then the organic layer was dried under reduced pressure at 50° C. for 12 hours to obtain 9.9 g of colorless and transparent oily substance.

The number average molecular weight (Mn) of the resulting substance determined by GPC was 1250 (20 repeating units) and the molecular weight distribution (Mw/Mn) was 1.15 (in terms of polystyrene). Furthermore, as a result of $^1$H-NMR measurement on the resulting substance by deuterated chloroform, it was confirmed that the substance was a polyether-based polymer (B) composed of 20 propylene oxide units (hereinafter referred to as (PO)20-Br) having a bromomethyl group at the polymerization starting terminal and a hydroxyl group at the polymerization terminating terminal.

$^1$H-NMR of (PO)20-Br obtained above is shown below.

$^1$H-NMR (500 MHz, CDCl$_3$) δ=3.93 (1H, CH(CH$_3$)OH), 3.55 (40H, —CH$_2$CH(CH$_3$)O—), 3.40 (20H, —CH$_2$CH(CH$_3$)O—), 3.35 (2H, —CH$_2$Br), 1.15 (60H, —CH$_2$CH(CH$_3$)O—), 1.10 (3H, CH(CH$_3$)OH).

(2) Quaternization Reaction with 1-Methylimidazole;

5.0 g of (PO)20-Br obtained above, 4.1 g of 1-methylimidazole (Me Im) and 10.0 g of acetonitrile (ACN) were added to a glass reactor equipped with a stirrer whose inner atmosphere had been replaced with argon, and the whole content was stirred 80° C. for 24 hours. After completion of the reaction, the reaction solution was cooled to room temperature (20° C., the same applies hereinafter) to terminate the reaction. The resulting reaction mixture was washed with a solution of equivalent weight of toluene/ethanol/ water, then an organic phase including an unreacted 1-methylimidazole and toluene was removed, and the aqueous phase was dried under reduced pressure at 50° C. for 12 hours to obtain 5.4 g of pale-yellow and transparent oily substance.

The number average molecular weight (Mn) of the resulting substance determined by GPC was 1300 and the molecular weight distribution (Mw/Mn) was 1.18 (in terms of polystyrene). Furthermore, as a result of carrying out $^1$H-NMR measurement with deuterated chloroform, the substance was identified to be a polyether-based polymer (A) composed of 20 propylene oxide units (hereinafter referred to as (PO)20-MeImBr) having a 1-methylimidazolium bromide structure at the starting terminal in which all bromo groups at the polymerization starting terminal of the (PO) 20-Br as a starting material were substituted by 1-methylimidazolium groups and a bromide ion was included as a counter anion.

$^1$H-NMR of the (PO)20-MeImBr obtained above is shown below.

$^1$H-NMR (500 MHz, CDCl$_3$) δ=10.72-10.56 (1H, MeIm+), 7.74-7.52 (2H, MeIm+), 4.06 (3H, MeIm+), 3.90 (1H, CH(CH$_3$)OH), 3.55 (40H, —CH$_2$CH(CH$_3$)O—), 3.40 (20H, —CH$_2$CH(CH$_3$)O—), 1.15 (60H, —CH$_2$CH(CH$_3$)O—).

Production Example 2

A polyether-based polymer (A) with a number average molecular weight of 3100 composed of 50 propylene oxide units (hereinafter referred to as (PO)50-MeImBr) having a 1-methylimidazolium bromide structure at the starting terminal, in which all bromo groups at the polymerization starting terminal were substituted by 1-methylimidazolium groups and a bromide ion was included as a counter anion, was produced in the same way as Production Example 1 except that the addition amount of the tetra-n-butylammonium bromide was changed to 1.1 g (3.3 mmol) and the addition amount of the triethylaluminum was changed to 0.57 g (5 mmol).

Production Example 3

A polyether-based polymer (A) with a number average molecular weight of 6000 composed of 100 propylene oxide units (hereinafter referred to as (PO)100-MeImBr) having a 1-methylimidazolium bromide structure at the starting terminal in which all bromo groups at the polymerization starting terminal were substituted by 1-methylimidazolium groups and a bromide ion was included as a counter anion, was produced in the same way as Production Example 1 except that the addition amount of tetra-n-butylammonium bromide was changed to 0.55 g (1.7 mmol) and the addition amount of the triethylaluminum was changed to 0.29 g (2.55 mmol).

Production Example 4

A polyether-based polymer (A) with a number average molecular weight of 12000 composed of 200 propylene oxide units (hereinafter referred to as (PO)200-MeImBr) having a 1-methylimidazolium bromide structure at the starting terminal in which all bromo groups at the polymerization starting terminal were substituted by 1-methylimidazolium groups and a bromide ion was included as a counter anion, was produced in the same way as Production Example 1 except that the addition amount of tetra-n-butylammonium bromide was changed to 0.28 g (0.86 mmol) and the addition amount of triethylaluminum was changed to 0.15 g (1.29 mmol).

Production Example 5

A polyether-based polymer (A) with a number average molecular weight of 1300 composed of 20 propylene oxide units (hereinafter referred to as (PO)20-BuMe$_2$NBr) having a n-butyldimethylammonium bromide structure at the starting terminal in which all bromo groups at the polymerization starting terminal were substituted by n-butyldimethylammonium groups and a bromide ion was included as a counter anion, was produced in the same way as Production Example 1 except that 5.1 g of n-butyldimethylamine (BuMe$_2$N) was added instead of 1-methylimidazole.

Production Example 6

2.7 g of (PO)20-MeImBr obtained in Production Example 1, 1.5 g (5.2 mmol) of lithium bis(trifluoromethanesulfonyl) imide (LiTFSI), and 20 mL of ion-exchanged water were added to a glass reactor equipped with a stirrer. After reaction at room temperature (20° C.) for 60 minutes, the reaction mixture was dried under reduced pressure at 50° C. for 1 hour to obtain a pale-yellow and transparent oily substance. The obtained oily substance was dissolved in a mixed solution of methanol/acetone/THF, and the crystalline insoluble remaining after dissolution were separated, and then dried under reduced pressure at 50° C. for 12 hours to obtain 3.2 g of a pale-yellow transparent oily substance.

When the resulting pale-yellow transparent oily substance was dissolved in dimethylsulfoxide-d6 and subjected to $^1$H-NMR measurement, it was confirmed that the substance was a polyether-based polymer (A) with a number average molecular weight of 1500 composed of 20 propylene oxide units (hereinafter referred to as (PO)20-MeImTFSI) having a 1-methylimidazolium TFSI structure at the starting terminal in which all bromide ions in (PO)20-MeImBr were anion-exchanged by bis(trifluoromethylsulfone)imide anions (TFSI).

$^1$H-NMR data of the (PO)20-MeImTFSI obtained above is shown below.

$^1$H-NMR (500 MHz, DMSO-d6) δ=9.21-9.06 (1H, MeIm+), 7.84-7.72 (2H, MeIm+), 3.86 (3H, MeIm+), 3.50-3.32 (60H, —CH$_2$CH(CH$_3$)O—), 1.04 (60H, —CH$_2$CH(CH$_3$)O—).

Example 1

1.0 g of (PO)20-MeImBr obtained in Production Example 1 and 0.1 g of SGCNT were added to an automatic mortar and mixed with a high shear force at room temperature for 30 minutes to obtain a gel composition of SGCNT/(PO)20-MeImBr. This composition was centrifuged with a centrifuge at 3000 rotations/minute for 30 minutes and visually observed, indicating no change and no bleeding.

Example 2

A gel composition of SGCNT/(PO)50-MeImBr was obtained by the similar operation to that in Example 1 except that the (PO)20-MeImBr obtained in Production Example 1 was exchanged to the (PO)50-MeImBr obtained in Production Example 2. This composition was centrifuged with a centrifuge at 3000 rotations/minute for 30 minutes and visually observed, indicating no change and no bleeding.

Example 3

A gel composition of SGCNT/(PO)100-MeImBr was obtained by the similar operation to that in Example 1 except that the (PO)20-MeImBr obtained in Production Example 1 was exchanged to the (PO)100-MeImBr obtained in Production Example 3. This composition was centrifuged with a centrifuge at 3000 rotations/minute for 30 minutes and visually observed, indicating no change and no bleeding.

Example 4

A gel composition of SGCNT/(PO)200-MeImBr was obtained by the similar operation to that in Example 1 except that the (PO)20-MeImBr obtained in Production Example 1 was exchanged to the (PO)200-MeImBr obtained in Production Example 4. This composition was centrifuged with a centrifuge at 3000 rotations/minute for 30 minutes and visually observed, indicating no change and no bleeding.

Example 5

A gel composition of SGCNT/(PO)20-BuMe$_2$NBr was obtained by the similar operation to that in Example 1 except that the (PO)20-MeImBr obtained in Production Example 1 was exchanged to the (PO)20-BuMe$_2$NBr obtained in Production Example 5. This composition was centrifuged with a centrifuge at 3000 rotations/minute for 30 minutes and visually observed, indicating no change and no bleeding.

Example 6

A gel composition of SGCNT/(PO)20-MeImTFSI was obtained by the similar operation to that in Example 1 except that the (PO)20-MeImBr obtained in Production Example 1 was exchanged to the (PO)20-MeImTFSI obtained in Production Example 6. This composition was centrifuged with a centrifuge at 3000 rotations/minute for 30 minutes and visually observed, indicating no change and no bleeding.

Example 7

19.9 g of ion-exchanged water was added to 0.11 g of SGCNT/(PO)20-MeImBr obtained in Example 1, adjusted so that the concentration of the SGCNT was 0.05 wt %, and ultrasonicated at room temperature for 60 minutes to obtain a uniform SGCNT/(PO)20-MeImBr/H$_2$O dispersion. The ultrasonication was carried out using Branson Digital Sonifier manufactured by Emerson Electric Co. under a condition of an ultrasonic output of 160 W, an oscillatory frequency of 40 kHz, duration: 60 minutes, and temperature: 20° C. In order to confirm the SGCNT dispersity in the resulting aqueous dispersion, a visible/near-infrared absorption spectrum was measured (measuring apparatus: V-670 manufactured by JASCO Corporation). The measurement results are shown in the FIGURE. As shown in the FIGURE, the absorbance of the SGCNT/(PO)20-MeImBr/H$_2$O dispersion at the wavelength of 500 nm is 2.49, and thus indicating that the SGCNT is uniformly dispersed.

Example 8

An SGCNT/(PO)50-MeImBr/H$_2$O dispersion was obtained by the similar operation to that in Example 7 except that the SGCNT/(PO)20-MeImBr obtained in Example 1 was changed to the SGCNT/(PO)50-MeImBr obtained in Example 2. The absorbance of the dispersion at the wavelength of 500 nm is 2.30, and thus indicating that the SGCNT is uniformly dispersed.

Example 9

An SGCNT/(PO)100-MeImBr/H$_2$O dispersion, was obtained by the similar operation to that in Example 7 except that the SGCNT/(PO)20-MeImBr obtained in Example 1 was changed to the SGCNT/(PO)100-MeImBr obtained in Example 3. The absorbance of the dispersion at the wavelength of 500 nm is 2.12, and thus indicating that the SGCNT is uniformly dispersed.

Example 10

An SGCNT/(PO)200-MeImBr/H$_2$O dispersion was obtained by the similar operation to that in Example 7 except that the SGCNT/(PO)20-MeImBr obtained in Example 1 was changed to the SGCNT/(PO)200-MeImBr obtained in Example 4. The absorbance of the dispersion at the wavelength of 500 nm is 1.55, and thus indicating that the SGCNT is sufficiently dispersed.

Comparative Example 1

0.1 g of an ethylmethylimidazolium TFSI ion liquid (hereinafter referred to as EMImTFSI) (manufactured by Sigma-Aldrich Co. LLC) and 0.01 g of SGCNT were added to an automatic mortar and mixed with a high shear force at room temperature for 30 minutes to obtain a gel composition of SGCNT/EMImTFSI. This composition was centrifuged with a centrifuge at 3000 rotations/minute for 30 minutes. The resulting composition was visually observed, indicating separation and bleeding between the SGCNT and the material.

Comparative Example 2

0.1 g of ethylmethylimidazolium chloride ion liquid (hereinafter referred to as EMImCl) (manufactured by Solvent Innovation GmbH) and 0.01 g of SGCNT were mixed in the similar way to that in Comparative Example 1 to obtain 0.11 g of a gel composition of SGCNT/EMImCl. 19.9 g of ion-exchanged water was added to the resulting composition, adjusted so that the concentration of the SGCNT was 0.05 wt %, and then ultrasonicated at room temperature for 60 minutes. It was visually confirmed that the SGCNT after ultrasonication was not allowed to be uniformly dispersed. Furthermore, as a result of measuring the visible/near-infrared absorption spectrum (V-670 manufactured by JASCO Corporation) of the resulting SGCNT/EMImCl/H$_2$O dispersion, the absorbance of the dispersion at the wavelength of 500 nm was 0.21. From this, SGCNT can be seen not dispersed. The visible/near-infrared absorption spectrum in this case is shown in the FIGURE.

Comparative Example 3

0.1 g of polyethylene oxide (hereinafter referred to as PEO, Mw=8000) and 0.01 g of SGCNT were mixed in the similar way to that in Comparative Example 1 to obtain 0.11 g of a gel composition of SGCNT/PEO. 19.9 g of ion-exchanged water was added to the resulting composition, adjusted so that the concentration of the SGCNT was 0.05 wt %, and then ultrasonicated at room temperature for 60 minutes. The SGCNT/PEO/H₂O dispersion after ultrasonication was visually confirmed, indicating that the SGCNT remained in a form of mass and was not allowed to be uniformly dispersed. Furthermore, as a result of measuring the visible/near-infrared absorption spectrum (V-670 manufactured by JASCO Corporation) of the SGCNT/PEO/H₂O dispersion, the absorbance of the dispersion at the wavelength of 500 nm was 0.83. From this result, it can be seen that the SGCNT is least dispersed. The visible/near-infrared absorption spectrum in this case is shown in the FIGURE.

Comparative Example 4

(Production of Polyepichlorohydrin by Living Anionic Polymerization)

3.22 g of tetra-n-butylammonium bromide and 50 ml of toluene were added to a glass reactor equipped with a stirrer whose inner atmosphere had been replaced with argon, and cooled to 0° C. Subsequently, 1.256 g of triethylaluminum (1.1 equivalent based on the tetra-n-butylammonium bromide) dissolved in 10 ml of n-hexane was added, and reacted at 0° C. for 15 minutes to obtain a catalyst solution.

Then 20.0 g of epichlorohydrin was added to the resulting catalyst solution, and polymerization reaction was carried out at 0° C. After the start of the polymerization reaction, the viscosity of the solution was slowly increased. After the reaction for 12 hours, a small amount of water was poured into the polymerization reaction solution to terminate the reaction. Subsequently, the resulting polymerization reaction solution was washed with a 0.1 N of hydrochloric acid aqueous solution to decalcify the catalyst residue, furthermore washed with ion-exchanged water, then the organic phase was dried under reduced pressure at 50° C. for 12 hours to obtain a colorless and transparent oily substance with a yield of 19.9 g. The number average molecular weight (Mn) of the resulting oily substance determined by GPC was 2,100, and the molecular weight distribution (Mw/Mn) was 1.30. Furthermore, as a result of ¹H-NMR measurement on the resulting oily substance, it was confirmed that the substance was a polyepichlorohydrin (22-mer on average) having a bromomethyl group at the polymerization starting terminal and a hydroxyl group at the polymerization terminating terminal.

(Quaternization Reaction with 1-Methylimidazole)

5.0 g of the resulting polyepichlorohydrin, 12.1 g of 1-methylimidazole and 10.0 g of acetonitrile were added to a glass reactor equipped with a stirrer whose inner atmosphere had been replaced with argon, and heated to 80° C. After the reaction at 80° C. for 48 hours, the mixture was cooled to room temperature to terminate the reaction. Subsequently, the resulting reactant was washed with a mixed solution of equivalent weight of toluene/methanol/water, then an organic phase containing 1-methylimidazole and toluene was removed, and the aqueous phase was dried under reduced pressure at 50° C. for 12 hours to obtain a pale-red solid with yield of 9.4 g. Subsequently, as a result of ¹H-NMR measurement and elemental analysis for the resulting solid, the solid was identified to be a polyether polymer in which all chloro groups in the epichlorohydrin unit of the polyepichlorohydrin as a starting material are substituted by 1-methylimidazolium chloride groups, and all bromo groups at the polymerization starting terminal are substituted by 1-methylimidazolium bromide groups. That is, a polyether compound (hereinafter referred to as (ECH) 22-MeImBr) having a lot of 1-methylimidazolium groups (cationic groups) not only at one terminal of the polymer chain but also at the main chain was obtained.

0.1 g of the resulting (ECH)22-MeImBr and 0.01 g of SGCNT were mixed in the same way as Comparative Example 1 to obtain 0.11 g of a gel composition of SGCNT/(ECH)22-MeImBr. 19.9 g of ion exchanged water was added to the resulting composition, and adjusted so that the concentration of the SGCNT aqueous solution was 0.05 wt %, and then ultrasonicated at room temperature for 60 minutes. The SGCNT/(ECH)22-MeImBr/H₂O dispersion after ultrasonication was visually confirmed, indicating that the SGCNT remained in a form of mass and not was allowed to be uniformly dispersed. Furthermore, as a result of the visible/near-infrared absorption spectrum (V-670 manufactured by JASCO Corporation) measurement of the SGCNT/(ECH)22-MeImBr/H₂O dispersion, the absorbance of the dispersion at the wavelength of 500 nm was 0.65. From this result, it can be seen that the SGCNT is least dispersed.

The types of the dispersants (polyether-based polymer etc.) obtained in Examples 1 to 10 and Comparative Examples 1 to 4, the number (n) of the oxirane monomer units of the polyether-based polymer, the number average molecular weight, the HLB value, the mixing ratio (g/g) of the dispersant and the SGCNT, the use or disuse of water and the use amount of the water (g), and their dispersion states are summarized in the following Table 1.

TABLE 1

| | Polyether-based polymer | Number of repeating units | Mn (g/mol) | HLB value | Polyether-based polymer/SGCNT (g/g) | H₂O (g) | Dispersion state of SGCNT | Form of polyether-based polymer composition |
|---|---|---|---|---|---|---|---|---|
| Example 1 | (PO)20-MeImBr | 20 | 1300 | 3.9 | 1/0.1 | — | Good | Bucky gel |
| Example 2 | (PO)50-MeImBr | 50 | 3100 | 2.9 | 1/0.1 | — | Good | Bucky gel |
| Example 3 | (PO)100-MeImBr | 100 | 6000 | 2.5 | 1/0.1 | — | Good | Bucky gel |
| Example 4 | (PO)200-MeImBr | 200 | 12000 | 2.3 | 1/0.1 | — | Good | Bucky gel |
| Example 5 | (PO)20-BuMe2NBr | 20 | 1300 | 2.3 | 1/0.1 | — | Good | Bucky gel |
| Example 6 | (PO)20-MeImTFSI | 20 | 1500 | 5.7 | 1/0.1 | — | Good | Bucky gel |
| Example 7 | (PO)20-MeImBr | 20 | 1300 | 3.9 | 0.1/0.01 | 19.9 | Good | Aqueous dispersion |
| Example 8 | (PO)50-MeImBr | 50 | 3100 | 2.9 | 0.1/0.01 | 19.9 | Good | Aqueous dispersion |
| Example 9 | (PO)100-MeImBr | 100 | 6000 | 2.5 | 0.1/0.01 | 19.9 | Good | Aqueous dispersion |
| Example 10 | (PO)200-MeImBr | 200 | 12000 | 2.3 | 0.1/0.01 | 19.9 | Good | Aqueous dispersion |
| Comparative Example 1 | EMIm-TFSI | — | 391 | 17.5 | 0.1/0.01 | — | Bad | Bucky gel |
| Comparative Example 2 | EMIm-Cl | — | 147 | 14.1 | 0.1/0.01 | 19.9 | Bad | Aqueous dispersion |
| Comparative Example 3 | PEO | 180 | 8000 | 20 | 0.1/0.01 | 19.9 | Bad | Aqueous dispersion |

TABLE 1-continued

|  | Polyether-based polymer | Number of repeating units | Mn (g/mol) | HLB value | Polyether-based polymer/SGCNT (g/g) | H₂O (g) | Dispersion state of SGCNT | Form of polyether-based polymer composition |
|---|---|---|---|---|---|---|---|---|
| Comparative Example 4 | (ECH)22-MeImBr | 22 | — | 12.7 | 0.1/0.01 | 19.9 | Bad | Aqueous dispersion |

The invention claimed is:

1. A polyether-based polymer composition comprising;
a polyether-based polymer represented by the following formula (2) including an oxirane monomer unit represented by the following formula (1), the polyether-based polymer represented by the following formula (2) having one cationic group substantially only at one terminal of a polymer chain, and
a nanocarbon material,

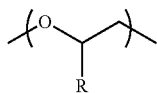
(1)

wherein in the formula (1), R represents a nonionic group,

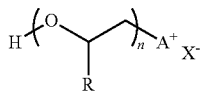
(2)

wherein in the formula (2), R represents a nonionic group, $A^+$ represents a cationic group, $X^-$ represents a counter anion, and n represents an integer of 20 or more.

2. The polyether-based polymer composition according to claim 1, wherein R represents a methyl group in the formula (2).

3. The polyether-based polymer composition according to claim 1, wherein the nanocarbon material is a carbon nanotube.

4. The polyether-based polymer composition according to claim 1, wherein a content of the nanocarbon material is 0.01 to 30 parts by weight based on 100 parts by weight of the polyether-based polymer.

5. The polyether-based polymer composition according to claim 1, wherein water is further contained and a content of the nanocarbon material is 0.05 wt % or more based on the whole composition.

6. The polyether-based polymer composition according to claim 1, wherein the content of the oxirane monomer unit in the polyether-based polymer being 95 wt % or more in the whole monomer units.

* * * * *